(12) United States Patent
Kataoka et al.

(10) Patent No.: US 6,320,115 B1
(45) Date of Patent: *Nov. 20, 2001

(54) SEMICONDONDUCTOR DEVICE AND A PROCESS FOR THE PRODUCTION THEREOF

(75) Inventors: Ichiro Kataoka, Tsuzuki-gun; Takahiro Mori, Ikoma; Satoru Yamada; Hidenori Shiotsuka, both of Tsuzuki-gun; Ayako Komori, Nara, all of (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/684,089

(22) Filed: Jul. 19, 1996

(30) Foreign Application Priority Data

Jul. 19, 1995 (JP) ....................................... 7-182952

(51) Int. Cl.⁷ ...................... H01L 25/00; H01L 31/0203; B29C 65/00; C09J 5/00
(52) U.S. Cl. ........................ 136/251; 136/259; 257/433; 156/285; 156/286; 156/311; 156/312; 438/7; 438/10; 438/118
(58) Field of Search .................... 136/251, 259; 257/433; 437/2–5, 207, 211–212, 216, 219; 156/285–286, 311–312

(56) References Cited

U.S. PATENT DOCUMENTS

| 4,067,764 | * | 1/1978 | Walker et al. | 156/267 |
| 4,249,958 | * | 2/1981 | Baudin et al. | 136/251 |
| 4,321,418 | * | 3/1982 | Dran et al. | 136/251 |
| 4,499,658 | * | 2/1985 | Lewis | 437/2 |
| 5,389,159 | | 2/1995 | Kataoka et al. | 136/251 |
| 5,480,494 | * | 1/1996 | Inoue | 136/251 |
| 5,593,532 | * | 1/1997 | Falk et al. | 156/285 |

* cited by examiner

*Primary Examiner*—Nam Nguyen
*Assistant Examiner*—Steven H. Ver Steeg
(74) *Attorney, Agent, or Firm*—Fitzpatrick, Cella, Harper & Scinto

(57) ABSTRACT

A semiconductor device having a semiconductor element, characterized in that said semiconductor device comprises a stacked body obtained by providing a laminate comprising said semiconductor element and a sealing resin which are interposed between a front surface member and a back face member, evacuating said laminate at a vacuum of 5 Torr or less for 5 to 40 minutes, subjecting the laminate thus treated to thermocompression bonding at a vacuum degree of 5 Torr or less, and cooling the laminate subjected to said thermocompression bonding so as to engage in contact bonding. The laminated semiconductor device is free of the air bubbles therein.

22 Claims, 7 Drawing Sheets

SEMICONDONCUTOR DEVICE AND A PROCESS FOR THE PRODUCTION THEREOF

BACKGROUND OF THE INVENTION

1. Field of the Invention

The present invention relates to an improved, highly reliable semiconductor device and a process for the production of said semiconductor device. More particularly, the present invention relates to an improved, highly reliable semiconductor device having a photoelectric conversion element sealed therein, specifically, an improved, highly reliable solar cell module having a sealing resin and a process for the production of said semiconductor device or solar cell module.

2. Related Background Art

In recent years, societal consciousness of the problems relating to the environment and energy has been increasing all over the world. Particularly, heating of the earth because of the so-called greenhouse effect due to an increase of atmospheric $CO_2$ has been predicted to cause a serious problem. In view of this, there is an increased demand for a means of power generation capable of providing clean energy without causing $CO_2$ buildup.

Now, public attention has been focused on solar cells in order to meet such demand, because they can supply electric power without causing such a problem as above mentioned and are expected to be a future power generation source, and they are safe and easy to handle.

In order to use such a solar cell as a power generation source, it is usually designed into a module in a desired configuration which can be used as the power generation source.

In FIG. 1, there is shown an example of such solar cell module.

FIG. 1 is a schematic cross-sectional view of the solar cell module. In FIG. 1, reference numeral 101 indicates a photovoltaic element (or a photoelectric conversion element), reference numeral 102 a sealing resin (that is, a filler resin), reference numeral 103 a transparent surface protective member, and reference numeral 104 a back face protective member.

As the surface protective member 103, a glass member most often has been used.

Now, in recent years, public attention has been focused on solar cell modules having a so-called thin film solar cell such as an amorphous silicon solar cell in which no glass member is used because they have various advantages such that they are light weight and excel in shock resistance and flexibility and they can be produced at a low cost.

In these solar cell modules, the surface protective member 103 to cover the light incident side of the photovoltaic element 101 usually comprises a transparent film excelling in weatherability, such as a fluororesin film. The back face protective member 104 covering the rear side of the photovoltaic element 101 usually comprises a resin film having an excellent insulating property, such as nylon film, polyester film, or the like. In the case where the back face protective member 104 is required to have moisture resistance and weatherability in addition to the insulating property, it usually comprises an aluminum foil sandwiched with TEDLAR (trademark name).

The sealing resin 102 serves as an adhesive between the photovoltaic element 101 and the surface protective member 103 and also as an adhesive between the photovoltaic element and the back face protective member 104. In addition to this, the sealing resin 102 also serves as a filler for filling irregularities at the surface of the photovoltaic element 101 and for preventing the photovoltaic element from being externally damaged and from suffering from external shocks. The sealing resin 102 is usually constituted by a transparent thermoplastic resin such as polyvinyl butyral resin (PVB) or ethylene-vinyl acetate copolymer (EVA). Of these thermoplastic resins, EVA has been widely used because the use thereof as the sealing resin 102 is advantageous in that it is inexpensive and easy to handle, its heat resistance can be improved by way of crosslinking, and it is highly durable against outdoor use over a long period of time.

SUMMARY OF THE INVENTION

The production of a semiconductor device (that is, a solar cell module) having the above described configuration shown in FIG. 1 using EVA as the sealing resin 102 can be conducted in a manner of providing a stacked body comprising EVA as the sealing resin 102 and a photovoltaic element 101 which are interposed between a surface protective member 103 and a back face protective member 104 and subjecting the stacked body to thermocompression treatment using a laminator of a double vacuum chamber system (hereinafter referred to as double vacuum chambered laminator).

FIG. 2 is a schematic diagram illustrating an example of such double vacuum chambered laminator. In FIG. 2, reference numeral 201 indicates a lower chamber, reference numeral 202 an upper chamber, and reference numeral 203 a flexible member comprising a silicone rubber sheet which is hermetically sealingly provided between the lower chamber 201 and the upper chamber 202 so as to isolate one from the other. The lower chamber 201 contains a metal mounting table 204 installed therein. The mounting table 204 is provided with an electric heater 205 installed therein. The lower chamber 201 is provided with an exhaust pipe 206 which is connected to a vacuum pump (not shown). The upper chamber 202 is provided with an exhaust pipe 207 which is connected to a vacuum pump (not shown). Reference numeral 208 indicates an O-ring disposed between the lower chamber 201 and the upper chamber 202. Reference numeral 209 indicates an object to be treated which is positioned on the mounting table 204. The mounting table 204 is also provided with a cooling system (not shown) through which a cooling medium such as cooling water is circulated in order to cool the object 209.

Description will now be made of a manner of treating the above described stacked body using the laminator shown in FIG. 2 to produce a solar cell module while using a crosslinking type EVA as the sealing resin 102.

First, the stacked body as the object 209 to be treated is positioned on the mounting table 204 of the lower chamber 201. Thereafter, the interior of each of the lower chamber 201 and the upper chamber 202 is exhausted to a predetermined vacuum through the exhaust pipes 206 and 207 by operating the vacuum pump (not shown). Successively, the stacked body 209 is heated to a predetermined temperature at which the EVA as the sealing resin 102 can be fused without being crosslinked, by means of the electric heater 205. Then, while continuing the evacuation of the lower chamber 201, only the pressure of the interior of the upper chamber 202 is returned to atmospheric pressure, wherein the flexible member 203 (the silicone rubber sheet) is sagged toward the lower chamber 201 side to compress the stacked body. Thereafter, the stacked body 209 is heated to and maintained at a predetermined temperature at which the EVA as the sealing resin 102 can be crosslinked by means of the electric heater 205. The stacked body 209 thus treated is cooled to a predetermined temperature by means of a cooling system (not shown), and it is taken out of the laminator. By this procedure, there can be obtained a solar cell module.

A semiconductor device (that is, a solar cell module) having the above described configuration shown in FIG. 1 using a crosslinking type EVA as the sealing resin 102 can also be produced using a laminator of a single vacuum chamber system (hereinafter referred to as single vacuum chambered laminator).

FIG. 3 is a schematic diagram illustrating an example of such single vacuum chambered laminator. The laminator shown in FIG. 3 comprises a mounting table 301 made of a metal which is provided with an exhaust system 304 which is connected to a vacuum pump (not shown). The mounting table 301 is provided with an electric heater 303 installed therein. Reference numeral 302 indicates a flexible member comprising a silicone rubber sheet which is disposed above the mounting table 301 such that a space is established between the surface of the mounting table 301 and the flexible member 302 as shown in FIG. 3. Reference numeral 305 indicates an O-ring which forms a hermetic seal between the mounting table 301 and the flexible member 302. Reference numeral 306 indicates an object to be treated which is positioned on the surface of the mounting table 301 and within said space. The exhaust system 304 has a plurality of openings into the above described space. The laminator shown in FIG. 3 is also provided with a cooling system such as a fan (not shown) which can supply a cooling medium such as air to cool the object 306.

Description will now be made of a manner of producing a solar cell module using the laminator shown in FIG. 3.

First, there is provided a stacked body for a solar cell module, comprising a crosslinking type EVA as the sealing resin 102 and a photovoltaic element 101 which are interposed between a surface protective member 103 and a back face protective member 104.

The stacked body as the object 306 to be treated is positioned on the surface of the mounting table 301, and a silicone rubber sheet as the flexible member 302 is superposed over the stacked body 306 on the mounting table 301 while forming a hermetic seal between the mounting table 301 and the flexible member 302 by means of the O-ring 305 as shown in FIG. 3. Then, the inside of the space containing the stacked body 306 between the flexible member 302 and the mounting table 301 is exhausted to a predetermined vacuum through the openings of the exhaust system 304 by operating the vacuum pump (not shown) to sag the flexible member 302 toward the mounting table 301 side, thereby compressing the stacked body 306. Then, the stacked body 306 is heated to and maintained at a predetermined temperature at which the EVA of the stacked body is crosslinked by means of the electric heater 303. The stacked body thus treated is cooled to a predetermined temperature by means of the cooling system (not shown), and it is taken out from the laminator. By this procedure, there can be obtained a solar cell module.

Now, in the procedure using the single vacuum chambered laminator, being different from the manner using the double vacuum chambered laminator, the stacked body is compressed at the time of conducting the vacuum exhaustion, wherein the air present in the gaps of the stacked body is difficult to be sufficiently released to the outside and therefore, there is a tendency that the module obtained after the lamination treatment is accompanied by residual air bubbles and is defective in terms of exterior appearance.

In order to prevent the occurrence of this problem in the process using the single vacuum chambered laminator, it is possible to insert a nonwoven fiber member into the stacked body.

FIG. 4 is a schematic explanatory view illustrating an example of the constitution of such stacked body having a nonwoven fiber member inserted therein. In FIG. 4, reference numeral 400 indicates a stacked body for a semiconductor device (a solar cell module), reference numeral 401 a photovoltaic element (or a semiconductor element), reference numeral 402 a nonwoven fiber member, reference numeral 403 a sealing resin (for example, EVA), reference numeral 404 a front surface protective member, and reference numeral 405 a back face protective member.

In this embodiment, the nonwoven fiber members 402 comprise a nonwoven glass fiber member for the purpose of facilitating the release of the air present in the gaps of the stacked body. In this case, the air present in the stacked body can be released to the outside through the gaps of the nonwoven glass fiber member during the exhaustion process. By this process, the possibility of entailing the foregoing problem of causing the generation of residual air bubbles in the stacked body in the manner using the single vacuum chambered laminator can be improved. Further, in this case, the glass fiber member has a refractive index which is quite similar to that of EVA, and therefore, when the glass fiber member is disposed on the light incident side of the photovoltaic element, a substantial loss in the quantity of light impinged due to light scattering does not occur. In addition to this, the glass fiber member excels in weatherability. In this respect, the use of the glass fiber member is advantageous.

However, either of the methods using the single vacuum chambered laminator and the double vacuum chambered laminator is liable to entail a problem in that the resulting module is accompanied by residual air bubbles therein due to insufficient exhaustion therefrom. This problem is very likely to occur in the process using the single vacuum chambered laminator. Particularly, even if the glass fiber member is used as above described, in the case where the stacked body is of a large size, the generation of residual air bubbles is liable to occur in the stacked body, whereby the stacked body obtained after the lamination treatment is defective in terms of exterior appearance. This situation leads to a reduction in the yield of the semiconductor device (a solar cell module) produced. As for the reason for this, it is considered that since the stacked body has a large size, the stacked body unavoidably has an increased resistance to exhausting the air present in the gaps of the stacked body and therefore, the air present in the stacked body cannot be completely released to the outside.

Now, as for a solar cell module having a surface covering layer comprising a fluororesin film under which EVA containing a crosslinking agent as the sealing resin for the photovoltaic element is situated, when the solar cell module is subjected to a temperature cycle test, temperature and humidity cycle test, and outdoor exposure test in order to evaluate its reliability, there is a tendency for the fluororesin film to be peeled. As for the fluororesin film, it is usually designed to have a corona-discharged surface contacting the sealing resin in order to attain an improvement in the adhesion of the fluororesin film with the sealing resin.

However, even in this case, the fluororesin film is still sometimes peeled in the above described tests because its adhesion with the sealing resin is not sufficient. As one of the causes of this problem, there is considered the vacuum degree employed in the lamination process. In more detail, there are considered such reasons as described in the following. That is, as a mechanism of bonding the fluororesin film with the EVA as the sealing resin, there is considered the generation of covalent boding due to radicals provided by the crosslinking agent contained in the EVA between the corona-discharged surface of the fluororesin film and the EVA sealing resin. In the case where the vacuum degree employed in the lamination process is low, it is considered that the generation of said radical is prevented by oxygen remaining in the system of the lamination process and because of this, a sufficient adhesion between the EVA as the sealing resin and the fluororesin film cannot be attained. In this case, it is also considered that the EVA as the sealing resin itself is not sufficiently crosslinked and because of this, the EVA is liable to soften under a high-temperature use condition, resulting in causing a separation between the sealing resin and the fluororesin film.

Accordingly, an object of the present invention is to provide a semiconductor device including a solar cell module provided with an improved surface covering material which is hardly peeled even upon repeated outdoor use under environmental conditions having changes in temperature and humidity.

Another object of the present invention is to provide a high yield process for the production of a semiconductor device including a solar cell module having an improved covering material with no residual air bubbles and which has an excellent exterior appearance.

A further object of the present invention is to provide a semiconductor device which comprises a stacked body obtained by providing a laminate comprising a semiconductor element and a sealing resin which are interposed between a front surface member and a back face member, subjecting said laminate to a vacuum of 5 Torr or less for 5 to 40 minutes, subjecting the laminate thus treated to thermocompression bonding under a vacuum of 5 Torr or less, and cooling the laminate subjected to said thermocompresesion bonding to engage in contact boding.

A further object of the present invention is to provide a process for the production of a semiconductor device by subjecting a stacked body comprising a semiconductor element and a sealing resin which are interposed between a front surface member and a back face member to thermocompression bonding while conducting vacuum exhaustion, characterized in that said process comprises: (a) a step of subjecting said stacked body to a vacuum of 5 Torr or less for 5 to 40 minutes, (b) a step of subjecting the stacked body vacuum-treated in said step (a) to thermocompression bonding while maintaining the conditions in said step (a) with a vacuum of 5 Torr or less, and (c) a step of cooling the stacked body treated in said step (b) to engage in contact bonding while maintaining the conditions in said step (a) with a vacuum of 5 Torr or less.

A feature of the process for the production of a semiconductor device in the present invention is that under the vacuum of 5 Torr or less, a stacked body comprising a semiconductor element and a sealing resin which are interposed between a front surface member and a back face member is vacuumed for 5 to 40 minutes, then the stacked body thus vacuum-treated is subjected to thermocompression bonding, and successively, the stacked body subjected to said thermocompression bonding is cooled to engage in contact bonding.

According to the process for the production of a semiconductor device in the present invention, there are provided such significant advantages as will be described below.

(1) Because the stacked body for a semiconductor device is sufficiently vacuumed, the air present in the gaps of the stacked body is entirely released to the outside and hence the treated stacked body is free of residual air bubbles therein.

(2) And, in the case where the sealing resin is crosslinked by means of an organic peroxide, the generation of a covalent bonding between the front surface member and the sealing resin and the crosslinking of the sealing resin itself are desirably produced without being hindered by oxygen. Because of this, there is attained an excellent adhesion between the front surface member and the sealing resin, and a problem in that the sealing resin is softened to cause a separation of the surface member does not occur, even upon repeated use under environmental conditions with a high temperature.

In the present invention, the stacked body preferably has a nonwoven glass fiber member, a nonwoven organic resin fiber member, or both of these fibers inserted therein.

Further, the sealing resin disposed between the photovoltaic element and the surface member is preferably constituted by EVA (ethylene-vinyl acetate copolymer), and the surface member is constituted by a transparent film composed of a fluorine-containing polymer.

The EVA as the sealing resin is preferably crosslinked by an organic peroxide.

The fluorine-containing polymer of the transparent film as the surface member is preferably ETFE (ethylene-tetrafluoroethylene copolymer).

In addition, the fluorine-containing polymer film is preferably designed such that it has a corona-discharged surface to be contacted with the sealing resin.

Further, in the process for the production of a semiconductor in the present invention, the thermocompression bonding of the stacked body is preferably conducted by supporting the stacked body between a plate as the mounting table and a compressing member (or a flexible member) comprising a silicone rubber sheet for example, evacuating the space between the mounting table and the compressing member, and applying the compressing member to the stacked body in the evacuation step, the thermocompression bonding step, and cooling step by means of a single vacuum chamber.

DESCRIPTION OF THE INVENTION AND PREFERRED EMBODIMENTS

The present invention has been made to attain the above described objects.

As above described, the present invention provides an improved, highly reliable semiconductor device and a method for the production of said semiconductor device.

A typical embodiment of the semiconductor device according to the present invention comprises a stacked body obtained by providing a laminate comprising a semiconductor element such as a photoelectric conversion element including a photovoltaic element and a sealing resin which are interposed between a front surface member (or a front surface protective member) and a back face member (or a back face protective member), subjecting said laminate to a vacuum of 5 Torr or less for 5 to 40 minutes, subjecting the laminate thus treated to thermocompression bonding under a vacuum of 5 Torr or less, and cooling the laminate subjected to said thermocompression bonding to engage in contact bonding.

A typical embodiment of the process for the production of a semiconductor device comprises (a) a step of subjecting a stacked body for a semiconductor device comprising a semiconductor element such as a photoelectric conversion element including a photovoltaic element and a sealing resin which are interposed between a front surface member (or a front surface protective member) and a back face member (or a back face protective member) to a vacuum of 5 Torr or less for 5 to 40 minutes, (b) a step of subjecting the stacked body vacuum-treated in said step (a) to thermocompression bonding while maintaining the condition in said step (a) of a vacuum of 5 Torr or less, and (c) a step of cooling the stacked body treated in said step (b) to engage in contact bonding while maintaining the condition in said step (a) with a vacuum of 5 Torr or less.

In the following, description will be made of a solar cell module as a semiconductor device according to the present invention.

Figure 5:
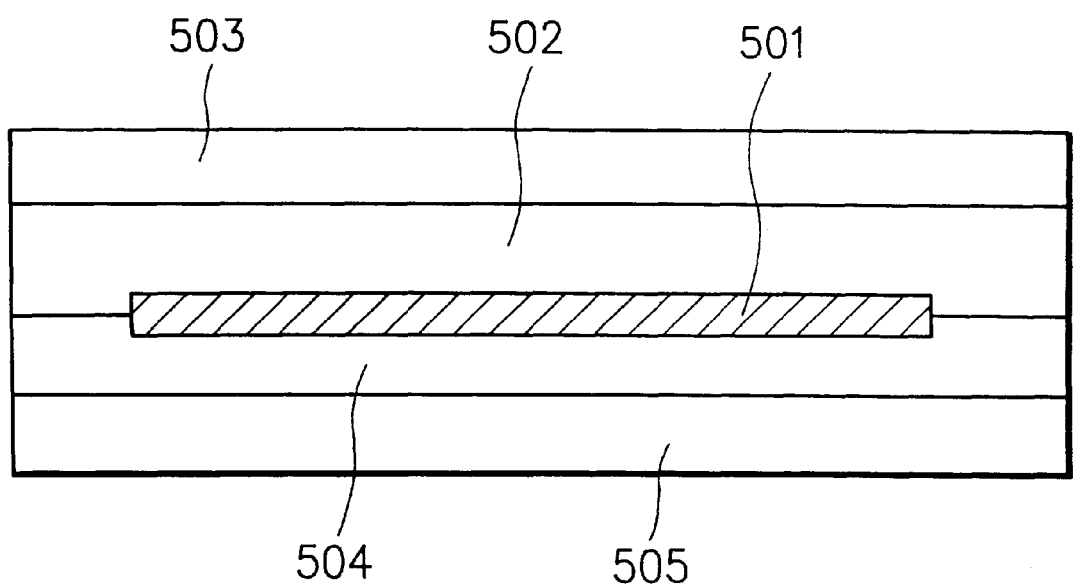
FIG. 5 is a schematic cross-sectional view illustrating a semiconductor device (or a solar cell module).

FIG. 5 is a schematic cross-sectional view illustrating the constitution of an example of a solar cell module as a semiconductor device according to the present invention.

In FIG. 5, reference numeral 501 indicates a photovoltaic element as a semiconductor element, reference numeral 502 a transparent or substantially transparent sealing resin (this sealing resin will be hereinafter referred to as the front surface side sealing resin), reference numeral 503 a transparent or substantially transparent surface member which is positioned at the outermost front surface (this member will be hereinafter referred to as the front surface protective member), reference numeral 504 a sealing resin on the rear side of the photovoltaic element 501 (this sealing resin will be hereinafter referred to as backside sealing resin), and reference numeral 505 a back face member (this member will be hereinafter referred to as the back face protective member).

In the solar cell module shown in FIG. 5, light is impinged through the front surface protective member 503 side, and the light impinged passes through the front surface protective member 503 and front surface side sealing resin 502 to arrive in the photovoltaic element 501.

The photoelectromotive force generated in the photovoltaic element 501 is outputted through output terminals (not shown).

The photovoltaic element 501 may comprise an appropriate photovoltaic element such as a single crystal silicon solar cell, polycrystalline silicon solar cell, amorphous silicon solar cell, copper-indium-selenide solar cell, or a compound semiconductor solar cell.

Herein, as an example of such photovoltaic element, description will be made of a photovoltaic element having a structure comprising a semiconductor active layer as a photoelectric conversion member and a transparent and conductive layer disposed in the named order on an electrically conductive substrate.

Figure 6A:
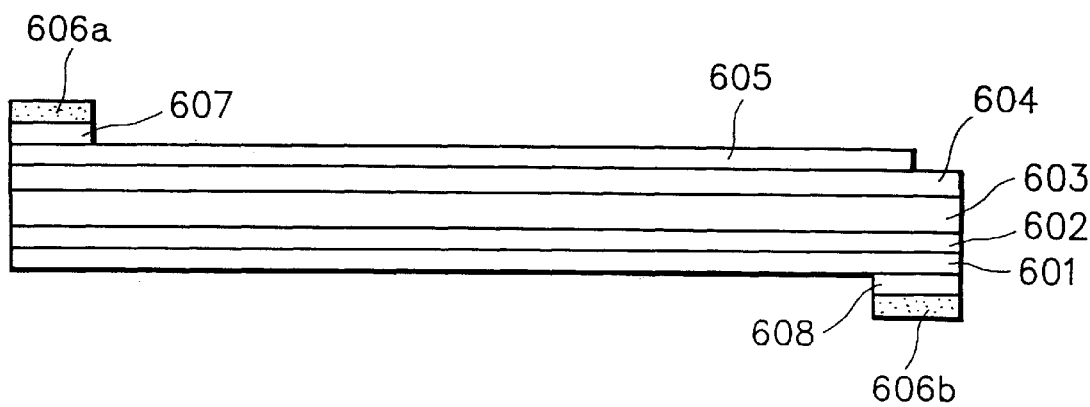
FIG. 6(a) is a schematic cross-sectional view illustrating the constitution of an example of a photoelectric conversion element which can be used in the present invention.
Figure 6B:
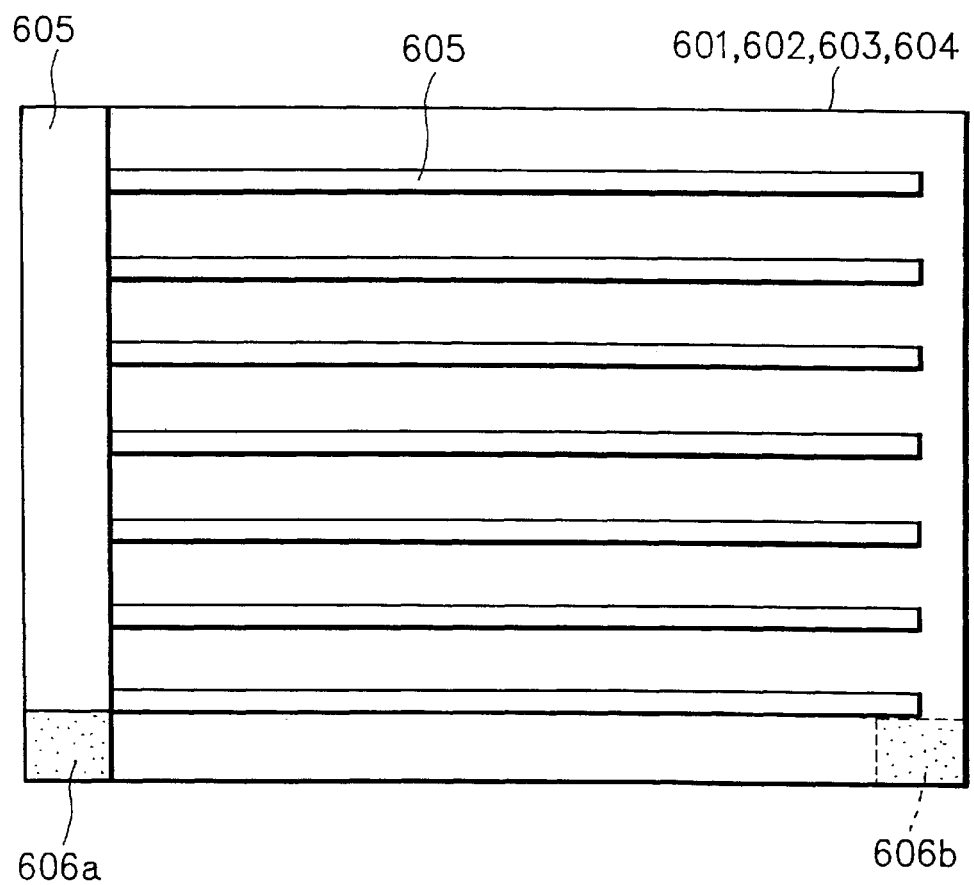
FIG. 6(b) is a schematic plan view illustrating a light receiving face of the photoelectric conversion element shown in FIG. 6(a).

FIG. 6(a) is a schematic cross-sectional view illustrating the constitution of such photovoltaic element. FIG. 6(b) is a schematic plan view illustrating the light receiving face of the photovoltaic element shown in FIG. 6(a).

In FIGS. 6(a) and 6(b), reference numeral 601 indicates an electrically conductive substrate, reference numeral 602 a back reflecting layer, reference numeral 603 a semiconductor active layer, reference numeral 604 a transparent and conductive layer, reference numeral 605 a collecting electrode (or a grid electrode), reference numeral 606a a power output terminal on the positive side, reference numeral 606b a power output terminal on the negative side, reference numeral 607 an electrical connection means, and reference numeral 608 an electrical connection means.

The photovoltaic element shown in FIGS. 6(a) and 6(b) comprises the back reflecting layer 602, the semiconductor active layer 603, the transparent and conductive layer 604, and the collecting electrode 605 disposed in the named order on the electrically conductive substrate 601, wherein the output terminal 606a is electrically connected to the collecting electrode 605 by means of the electrical connection means 607 and it extends from the collecting electrode while being insulated by means of an insulating member (not shown), and the output terminal 606b is electrically connected to the electrically conductive substrate 601 by means of the electrical connection means 608. In this configuration, the positive side power output terminal and the negative side power output terminal may be changed into a negative side power output terminal and a positive side power output terminal depending upon the constitution of the semiconductor active layer.

The electrically conductive substrate 601 serves not only as a substrate for the photovoltaic element but also as a lower electrode. As for the electrically conductive substrate 601, there is no particular restriction as long as it has an electrically conductive surface. Specifically, it may be an electrically conductive member composed of a metal such as Si, Ta, Mo, W, Al, Cu, Ti, or Fe, or an electrically conductive member composed of an alloy of these metals such as stainless steel, or the like. Besides these, the electrically conductive substrate 601 may comprise a carbon sheet or a Pb-plated steel sheet.

Alternatively, the electrically conductive substrate 601 may be a film or sheet made of a synthetic resin or a sheet made of a ceramic. In this case, the substrate is coated with an electrically conductive film on the surface thereof.

The back reflecting layer 602 disposed on the electrically conductive substrate 601 may comprise a metal layer, a metal oxide layer, or a two-layered structure comprising a metal layer and a metal oxide layer. The metal layer may be composed of a metal such as Ti, Cr, Mo, W, Al, Ag, or Ni, or an alloy of these metals. The metal oxide layer may comprise a metal oxide such as ZnO, $TiO_2$, $SnO_2$, or the like.

The back reflecting layer 602 is desired to have a roughened surface in order to effectively utilize incident light.

The back reflecting layer 602 may be formed by a conventional film-forming technique such as resistance heating evaporation, electron beam evaporation, or sputtering.

The semiconductor active layer 603 functions to conduct photoelectric conversion. The semiconductor active layer may be composed of a non-single crystal silicon semiconductor material such as an amorphous silicon semiconductor material or polycrystalline silicon semiconductor material, or a compound semiconductor material. In any case, the semiconductor active layer comprised of any of these semiconductor materials may be of a stacked structure with a pin junction, a pn junction or a Shottky type junction. Specific examples of the compound semiconductor material are $CuInSe_2$, $CuInS_2$, GaAs, $CdS/Cu_2S$, CdS/CdTe, CdS/InP, $CdTe/Cu_2Te$, and the like.

The semiconductor active layer 603 comprised of any of the above mentioned semiconductor materials may be formed by a conventional film-forming technique. For instance, the non-single crystal silicon semiconductor active layer may be formed by a conventional chemical vapor phase growing technique such as plasma CVD or light-induced CVD using a film-forming raw material gas capable of supplying silicon atoms, such as silane gas, or a conventional physical vapor phase growing technique such as sputtering using a Si-target. The semiconductor active layer composed of a polycrystalline silicon semiconductor material may be formed by a conventional polycrystalline silicon film-forming method of providing a fused silicon material and subjecting the fused silicon. material to film-forming processing or another conventional polycrystalline silicon film-forming method of subjecting an amorphous silicon material to heat treatment.

The semiconductor active layer 603 composed of any of the above mentioned compound semiconductor materials may be formed by a conventional ion plating, ion beam deposition, vacuum evaporation, sputtering, or electrolytic technique in which a coating is formed by way of electrolysis of a desired electrolyte.

The transparent and conductive layer 604 functions as an upper electrode. The transparent and conductive layer may comprise $In_2O_3$, $SnO_2$, $In_2O_3$—$SnO_2$ (ITO), ZnO, $TiO_2$, or $Cd_2SnO_4$. Besides these, it may comprise a crystalline semiconductor layer doped with an appropriate impurity in a high concentration.

The transparent and conductive layer 604 constituted by any of the above mentioned materials may be formed by conventional resistance heating evaporation, electron beam evaporation, sputtering, spraying, or CVD.

The above described impurity-doped crystalline semiconductor layer as the transparent and conductive layer 604 may be formed by a conventional impurity-diffusion film-forming method.

For the purpose of effectively collecting electric current generated by virtue of a photoelectromotive force, the collecting electrode (or the grid electrode) 605 is disposed on the transparent and conductive layer 604. The collecting electrode 605 may be in the form of a stripe shape or comb shape.

The collecting electrode 605 may comprise a metal such as Ti, Cr, Mo, W, Al, Ag, Ni, Cu, or Sn, or an alloy of these metals. Alternatively, the collecting electrode 605 may be formed of an electrically conductive paste or an electrically conductive resin. The electrically conductive paste can include electrically conductive pastes comprising powdered Ag, Au, Cu, Ni, or carbon dispersed in an appropriate binder resin. The binder resin herein can include polyester, epoxy resin, acrylic resin, alkyd resin, polyvinyl acetate, rubber, urethane resin, and phenol resin.

The collecting electrode 605 may be formed by means of sputtering using a mask pattern, resistance heating evaporation, or CVD. It may also be formed by depositing a metal film over the entire surface and subjecting the metal film to etching treatment to form a desired pattern, by directly forming a grid electrode pattern by means of photo-induced CVD, or by forming a negative pattern corresponding to a grid electrode pattern and subjecting the resultant to plating treatment.

The formation of the collecting electrode 605 using any of the above described electrically conductive pastes may be conducted by subjecting the electrically conductive paste to screen printing or by fixing a metal wire to the screen-printed electrically conductive paste, if necessary, using a solder.

The output terminals 606a and 606b serve to output the electromotive force. The output terminal 606a is electrically connected to the collecting electrode 605 by means of the electrical connection means 607. The electrical connection means 607 may comprise an electrically conductive layer formed by using a metal body and an electrically conductive paste or a solder.

The output terminal 606b is electrically connected to the electrically conductive substrate by means of the electrical connection means 608. The electrical connection means 608 may comprise an electrical connection region formed by spot welding or soldering an appropriate metal body such as a copper tab.

In general, there are provided a plurality of photovoltaic elements having the above constitution, and they are integrated in series connection or in parallel connection depending upon the desired voltage or electric current. It is possible to dispose the integrated body on an insulating member such that a desired voltage or electric current can be obtained.

Description will now be made of the front surface side sealing resin 502 used in the present invention.

The front surface side sealing resin 502 serves to coat the irregularities at the surface of the photovoltaic element 501 (the semiconductor element) with a given resin, to prevent the photovoltaic element from being influenced by external factors such as temperature changes and/or humidity changes in the external environment, externally applied impacts, or the like and to attain a sufficient adhesion between the photovoltaic element and the surface protective member 503. Thus, the surface side sealing resin is required to excel in weatherability, adhesion, packing property, heat resistance, cold resistance, and impact resistance. In order for the surface side sealing resin 502 to meet these requirements, the surface side sealing resin is comprised of a resin selected from the group consisting of polyolefinic resins, butyral resins, urethane resins, silicone resins, and fluororesins. Specific examples are EVA (ethylene-vinyl acetate copolymer), EMA (ethylene-methyl acrylate copolymer), EEA (ethylene-ethyl acrylate copolymer), and polyvinyl butyral (PVB) resin. Of these resins, EVA is the most desirable because it exhibits well-balanced physical properties suitable for a solar cell when. used as the front surface side sealing resin.

Each of the above mentioned resins usable as the front surface side sealing resin 502 is low in heat deformation temperature and is liable to readily deform or creep at a high temperature. Because of this, each of these resins is desired to be crosslinked with an appropriate crosslinking agent so that it, has an increased heat resistance. As the crosslinking agent, there can be mentioned organic peroxides.

The crosslinking of the resin used as the front surface side sealing resin 502 using an organic peroxide as the crosslinking agent is performed by way of incorporating hydrogen atoms or halogen atoms in the resin by virtue of free radicals generated from the organic peroxide to form C—C bonds.

In order to make the organic peroxide generate such free radicals upon crosslinking the resin used as the front surface side sealing resin, the organic peroxide is preferably activated by means of a thermal decomposition process, redox decomposition process, or ion decomposition process. Of these processes, the thermal decomposition process is the most appropriate.

The organic peroxide usable as the cross-Linking agent in the present invention can include hydroperoxide, dialkyl (diallyl) peroxide, diacyl peroxide, peroxyketal, peroxyester, peroxycarbonate, and ketone peroxide.

The amount of such organic peroxide as the crosslinking agent to be added to the resin as the front surface side sealing resin is preferably in the range of from 0.5 to 5 parts by weight per 100 parts by weight of the front surface side sealing resin.

The organic peroxide as the crosslinking agent may be used together with the front surface side sealing resin upon thermocompression bonding the front surface side sealing resin under vacuum conditions and. while heating under compression conditions.

Conditions of the temperature and the period of time for the thermocompression bonding treatment in this case may be determined depending upon the thermodecomposition temperature property of the organic peroxide used. However, in general, these conditions are determined such that 90% or more or preferably 95% or more of the organic peroxide in the front surface side sealing resin is thermally decomposed, whereby the front surface side sealing resin is subjected to thermocompression bonding to the photovoltaic element and to the surface protective member while being crosslinked.

The degree of crosslinking of the front surface side sealing resin can be examined by observing the gel content of the resin. In order to prevent the front surface side sealing resin from being deformed, it is desired for the resin to be crosslinked such that the gel content is 70 wt. % or more.

In order to efficiently crosslink the front surface side sealing resin, it is preferred to use a crosslinking enhancer such as triarylcyanurate (TAIC) in addition to the organic peroxide as the crosslinking agent. In this case, the amount of the crosslinking enhancer to be added is preferably in the range of from 1 to 5 parts by weight per 100 parts by weight of the front surface side sealing resin.

The front surface side sealing resin 502 comprised of essentially the above described resin material excels in weatherability. However, in order to attain a further improved weatherability of the front surface side sealing resin and also in order to effectively protect a layer situated thereunder, it is possible for the front surface side sealing resin to contain an appropriate UV absorber. As such UV absorber, there can be used commercially available chemical compounds usable as a UV absorber. Specific examples are organic compounds such as salicylic acid series compounds, benzophenone series compounds, benzatriazole series compounds, and cyanoacrylate series compounds. In a preferred embodiment, it is desired to use a UV absorber having a low volatility in view of use environment of the solar cell module.

The amount of the UV absorber to be added is preferably in the range of from 0.1 to 1.0 wt. % of the amount of the front surface sealing resin.

Further, in order to improve the resistance of the front surface side sealing resin to photo-induced degradation, it is possible for the front surface side sealing resin to contain an appropriate photo stabilizer in addition to the above described UV absorber. Such photo stabilizer can include hindered amine series photo stabilizers. Although the hindered amine series photo stabilizers do not absorb ultraviolet rays as do the foregoing UV absorbers, a pronounced advantage is provided by using the hindered amine series light stabilizer in combination with the UV absorber.

The amount of the hindered amine series photo stabilizer to be added is preferably in the range of from 0.05 to 1.0 wt. % of the amount of the resin as the front surface side sealing resin.

Besides the above described hindered amine series photo stabilizers, there are known other photo stabilizers, but those photo stabilizers are not desirable to use in the front surface side sealing resin because most of them are colored and they are therefore liable to impart a negative influence of reducing the photoelectric conversion efficiency of a photovoltaic element, particularly in the case of a solar cell module.

In addition, in order to attain a further improved heat resistance and thermal processing property for the front surface side sealing resin, it is possible for the front surface side sealing resin to contain an appropriate antioxidant. Such antioxidant can include a monophenol series antioxidant, bisphenol series antioxidant, high-molecular phenol series antioxidant, sulphur series antioxidant, and a phosphorous series antioxidant.

The amount of the antioxidant to be added is preferably in the range of from 0.05 to 1.0 wt. % of the amount of the front surface side sealing resin.

Now, in the case where the solar cell module is used under severe environmental conditions, it is desired to have excellent adhesion between the front surface side sealing resin and the photovoltaic element and also between the front surface side sealing resin and the front surface protective member.

In order for the front surface side sealing resin to attain such adhesion, it is effective to incorporate an appropriate silane coupling agent or an appropriate organic titanate compound into the front surface side sealing resin. The amount of such silane coupling agent or organic titanate compound to be added is preferably in the range of from 0.1 to 3 parts by weight or more preferably in the range of from 0.25 to 1 part by weight, per 100 parts by weight of the front surface side sealing resin.

Now, in order to prevent a decrease in the quantity of incident light arriving in the photovoltaic element, the front surface side sealing resin is desired to be substantially transparent. Specifically, it is desired that the front surface side sealing resin have a transmittance of preferably 80% or more or more preferably 90% or more in the visible light wavelength region of 400 nm to 800 nm. Further, in order to facilitate external light impingement of the photovoltaic element, the front surface side sealing resin is desired to have a refractive index of preferably 1.1 to 2.0, or more preferably 1.1 to 1.6 at a temperature of 25° C.

There are commercially available EVA sheets containing the foregoing additives which are usable in a solar cell module. Specific examples are SOLAR EVA (trademark name, produced by High Sheet Kohgyo Kabushiki Kaisha), EVASAFE WG series EVA sheets (trademark name, produced by Bridgestone Kabushiki Kaisha), and PHOTOCAP (trademark name, produced by Springboorn Laboratories Company). By inserting any of these EVA sheets between the photovoltaic element and the front surface protective member and conducting thermocompression bonding therebetween, there can be readily obtained a solar cell module.

In the following, description will be made of the front surface protective member 503.

The front surface protective member 503 is positioned at the outermost front surface of the solar cell module and because of this, it is required to excel in transparency, weatherability, water repellency, heat resistance, pollution resistance, and physical strength. In addition, in the case where the solar cell module is used outdoors under severe environmental conditions, it is required for the front surface protective member to ensure that the solar cell module has sufficient durability upon repeated use over a long period of time.

Therefore, the front surface protective member 503 comprises a member which satisfies all these conditions. Such member includes tempered glass members, fluororesin films, and acrylic resin films. The tempered glass member excels in transparency and impact resistance and is hardly broken. Therefore it has been widely used as the front surface protective member of a solar cell module.

However, in recent years, there is an increased demand for the solar cell module to be light weight and excel in flexibility. In order to meet this demand, the front surface protective member is desired to comprise a highly transparent fluororesin film which excels especially in weatherability and pollution resistance.

Specific examples of such highly transparent fluororesin are polyvinylidene fluoride resin (PVdF), polyvinyl fluoride resin (PVF), ethylene-tetrafluoroethylene copolymer (ETFE), and the like. Of these fluororesins, PVdF is the best in terms of weatherability. In terms of weatherability and physical strength in combination, ETFE is the best.

The front surface protective member 503 is desired to be relatively thick in order to attain a sufficient physical strength. However, the thick front surface protective member is problematic in view of the production cost of the solar cell module and also the quantity of light transmitted therethrough. Therefore, the front surface protective member is desired to have a thickness preferably in the range of from 20 to 200 $\mu$m, or more preferably in the range of from 30 to 100 $\mu$m.

In order to attain a further improvement in the adhesion of the front surface protective member 503 with the front surface side sealing resin 502, the surface of the front surface protective member to be contacted with the front surface side sealing resin is preferably subjected to surface treatment. The surface treatment in this case can include corona discharging treatment, plasma treatment, ozone treatment, UV irradiation, electron beam irradiation, and flame treatment. Of these, the corona discharging treatment is the most desirable because it can be performed at a high speed while using a relatively simple apparatus.

In the following, description will be made of the back face protective member 505.

The back face protective member 505 has the function of electrically insulating the electrically conductive substrate of the photovoltaic element 501 from the outside. The back face protective member 505 is preferably composed of a material capable of sufficiently electrically isolating the electrically conductive substrate of the photovoltaic element and which excels in durability, withstands thermal expansion and contraction, and excels in flexibility. Specific examples of such material are nylon, polyethylene terephthalate (PET), and the like.

In the following, description will be made of the backside sealing resin 504.

The backside sealing resin 504 serves to provide adhesion between the photovoltaic element 501 and the back face protective member 505. The backside sealing resin 504 preferably comprises a material capable of sufficiently ensuring the adhesion between the electrically conductive substrate of the photovoltaic element 501 and the back face protective member 505 and which excels in durability, withstands thermal expansion and thermal contraction, and excels in flexibility. Specific examples of such material are hot-melt materials such as EVA (ethylene-vinyl acetate copolymer) and polyvinyl butyral, and epoxy adhesives. Besides these, double-coated tapes may also be used.

Alternatively, the backside sealing resin 504 may comprise the same resin material used for the front surface side sealing resin 502.

In the present invention, it is possible to dispose a back face reinforcing member (not shown in the figure) over the back face protective member 505 in order to improve the mechanical strength of the solar cell module and in order to prevent the solar cell module from being distorted or warped due to changes in the environmental temperature. The back face reinforcing member may comprise a steel plate, a plastic plate, or a fiber-glass reinforced plastic plate (or a so-called FRP plate).

In the following, description will be made of a process or the production of a solar cell module as a semiconductor device according to the present invention using the foregoing photovoltaic element, front surface side sealing resin, front surface protective member, backside sealing resin, and back face protective member.

In a typical embodiment, to enclose a light receiving face of the photovoltaic element 501 by the front surface side sealing resin 502 and the front surface protective member 503, a sheet of a given resin material usable as the front surface side sealing resin is provided, the sheet is interposed between the photovoltaic element and the front surface protective member, followed by subjecting to thermocompression bonding. The temperature and the period of time upon conducting the thermocompression bonding are determined so that the crosslinking reaction sufficiently proceeds. Enclosure of the rear side of the photovoltaic element by the backside sealing resin 504 and the back face protective member 505 may be conducted in the same manner as in the above.

The thermocompression bonding may be conducted by means of a vacuum thermocompression bonding process. The vacuum thermocompression bonding process can include a process using a double vacuum chamber or a process using a single vacuum chamber.

Herein, description will be made of an example of the thermocompression bonding process using a laminator of a single vacuum chamber type shown in FIGS. 7(*a*) and 7(*b*) (hereinafter referred to as single vacuum chambered laminator).

Figure 3:
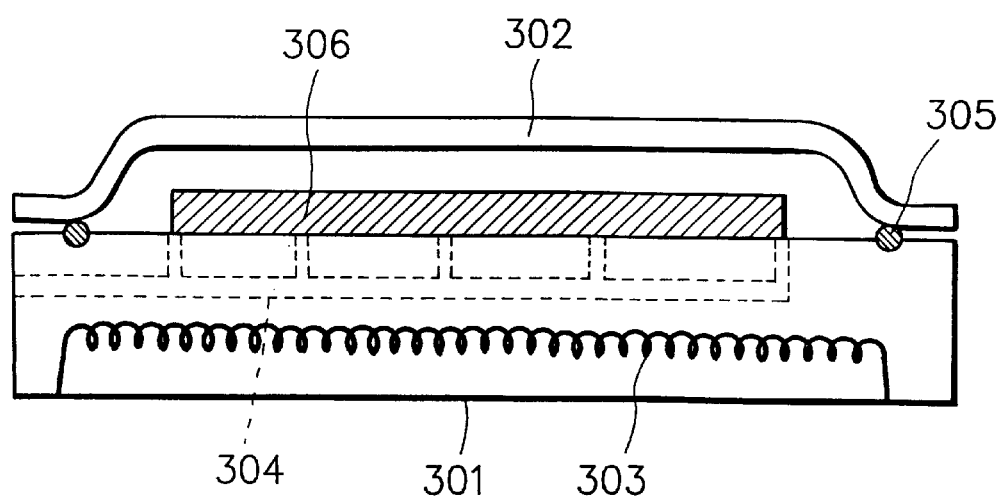
FIG. 3 is a schematic diagram illustrating a laminator of a single vacuum chamber type.
Figure 7A:
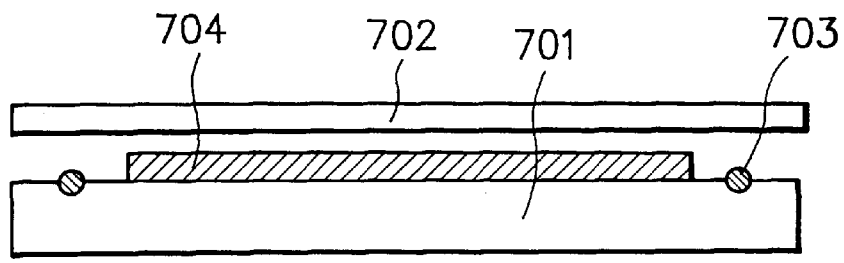
FIG. 7(a) is a schematic explanatory view of a preparatory step for conducting vacuum lamination by means of a single vacuum chamber laminator.
Figure 7B:
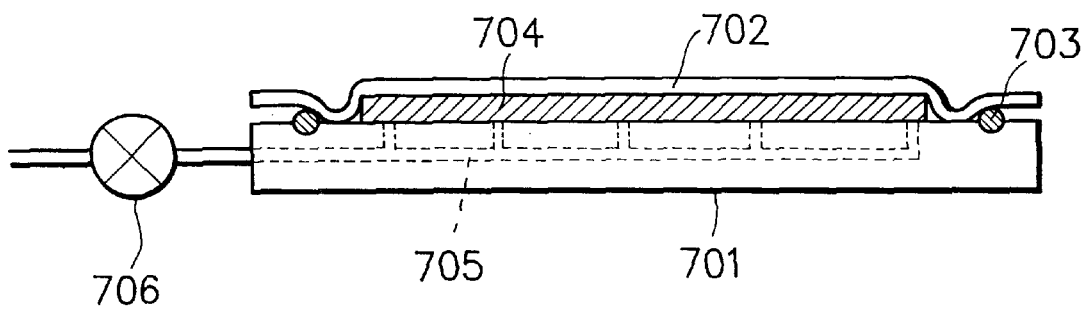
FIG. 7(b) is a schematic diagram illustrating a laminator of a single vacuum chamber type.

The single vacuum chambered laminator shown in FIGS. 7(a) and 7(b) is substantially the same as the single vacuum chambered laminator shown in FIG. 3.

Figure 4:
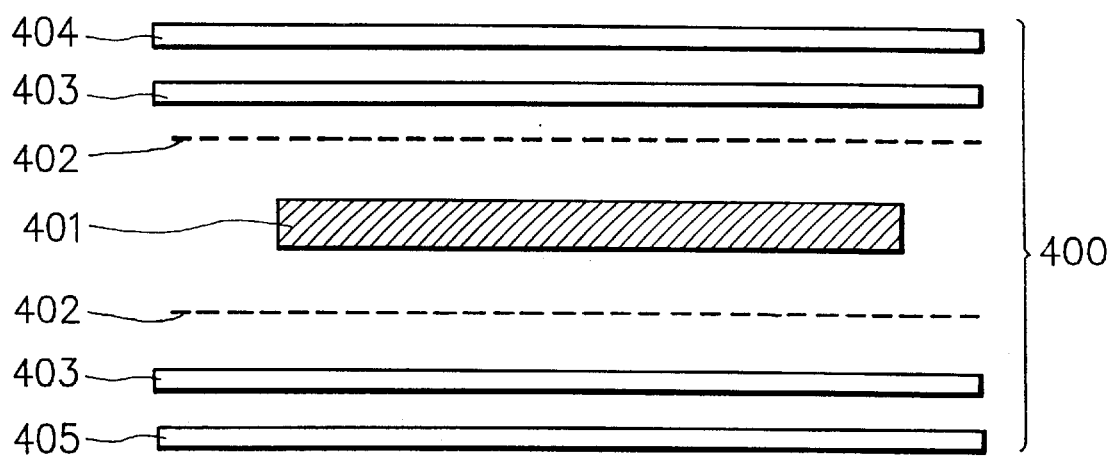
FIG. 4 is a schematic view illustrating the constitution of an example of a stacked body as a semiconductor device (or a solar cell module).

First, there is provided a stacked body such as explained with reference to FIG. 4. Particularly, as a stacked body 704 in FIGS. 7(a) and 7(b), there is provided a stacked body comprising a photovoltaic element 401, a front surface protective member 404, a back face protective member 405, and a sealing resin 403. In a preferred embodiment, one or more nonwoven fiber members 402 such as a nonwoven glass fiber member or a nonwoven organic resin fiber member are inserted in the stacked body. In a more preferred embodiment, such nonwoven fiber member is interposed between the photovoltaic element 401 and the front surface side sealing resin 403 and also between the photovoltaic element 401 and the backside sealing resin 403, as shown in FIG. 4. As the nonwoven fiber member 402 is immersed in EVA as the sealing resin, it serves to facilitate the release of the air present in the gaps of the stacked body in the foregoing vacuuming step and also to prevent the EVA from flowing to the end portions of the stacked body when the EVA is fused in the foregoing heat treatment step. In addition, the nonwoven fiber member serves as a reinforcing member for the EVA. Also, in the case where the front surface protective member comprises a film, the nonwoven fiber member functions to prevent damage present in the film from influencing the photovoltaic element.

Now, the stacked body 704 is positioned on the surface of a mounting table 701, and a silicone rubber sheet as a flexible member 702 is superposed over the stacked body on the mounting table 701 while forming a hermetic seal between the mounting table and the flexible member 702 by means of an O-ring 703. (see FIG. 7(a))

Thereafter, in a first step, the inside of the space containing the stacked body 704 between the flexible member 703 and the mounting table is exhausted to a predetermined vacuum through openings of an exhaust manifold system 705 connected to a vacuum pump (not shown) through a pipe provided with a valve 706 whereby the flexible member 702 is sagged toward the mounting table 701 to thereby compress the stacked body 704. (see FIG. 7(b))

Then, in a second step, an electric heater (not shown) installed in the mounting table 701 is energized to heat the stacked body to a predetermined temperature at which the EVA as the sealing resin of the stacked body is crosslinked, and the stacked body is maintained at this temperature until the crosslinking of the EVA is completed.

In a third step, the stacked body thus treated is cooled, and the stacked body is taken out from the laminator. By this procedure there is obtained a solar cell module.

During the first and second steps the space containing the stacked body is maintained at a vacuum of 5 Torr or less. In a preferred embodiment, it is held at a vacuum of 1 Torr or less. When the vacuum exceeds 5 Torr, even if the period of time for the first step should be prolonged, residual air bubbles are liable to remain in the sealing resin after the compression lamination of the stacked body. The period of time for the first step is preferably in the range of from 5 to 40 minutes or more preferably in the range of from 10 to 30 minutes.

In the case where the period of time for the first step is less than 5 minutes, the exhaustion of the air present in the gaps of the stacked body is insufficient and in this case, if the vacuum is less than 5 Torr, residual air bubbles are liable to remain in the stacked body. Further, the period of time for the first step takes too long to complete the lamination of the stacked body, resulting in a reduction in the productivity.

In the following, the present invention will be described in more detail with reference to examples which are not intended to restrict the scope of the present invention.

EXAMPLE 1

1. Preparation of Amorphous Silicon (a-Si) Photovoltaic Element (Solar Cell)

A solar cell having the configuration shown in FIGS. 6(a) and 6(b) and which has a semiconductor active layer composed of an amorphous silicon (a-Si) material was prepared in the following manner.

That is, there was firstly provided a well-cleaned stainless steel plate as a substrate 601. On the substrate 601, there was formed a two-layered back reflecting layer 602 comprising a 500 nm thick Al film and a 500 nm thick ZnO film by means of the conventional sputtering process. Successively, on the back reflecting layer 602, there was formed a tandem type a-Si photoelectric conversion semiconductor layer 603 comprising a 15 nm thick n-type layer/a 400 nm thick i-type layer/a 10 nm thick p-type layer/a 10 nm thick n-type layer/an 80 nm thick i-types layer/a 10 nm thick p-type layer deposited in the named order from the substrate side by means of a conventional plasma CVD process, wherein an n-type a-Si film as each n-type layer was formed from a mixture composed of $SiH_4$ gas, $PH_3$ gas and $H_2$ gas; an i-type a-Si film as each i-type layer was formed from a mixture composed of $SiH_4$ gas and $H_2$ gas; and a p-type uc-Si film as each p-type layer was formed from a mixture composed of $SiH_4$ gas, $BF_3$ gas and $H_2$ gas. Then, on the semiconductor active layer 603, there was formed a 70 nm thick $In_2O_3$ film as a transparent and conductive layer 604 by means of the conventional heat resistance evaporation process wherein an In-source was evaporated in an $O_2$ atmosphere. Then an Ag-paste was screen-printed on the transparent and conductive layer 604, followed by drying, to thereby form a grid electrode as a collecting electrode 605. As for the resultant, a copper tab as a negative side power output terminal 606b was fixed to the substrate 601 using a stainless solder 608, and a tin foil tape as a positive side power output terminal 606a was fixed to the collecting electrode 605D using an electrically conductive adhesive 607. Thus, there was prepared an a-Si solar cell. In this way, there were obtained a plurality of a-Si solar cells.

These solar cells were integrated in series connection to obtain a cell group having an outer size of 300 mm×1200 mm.

The above procedures were repeated to obtain a plurality of cell groups.

2. Preparation of Module

Figure 8:
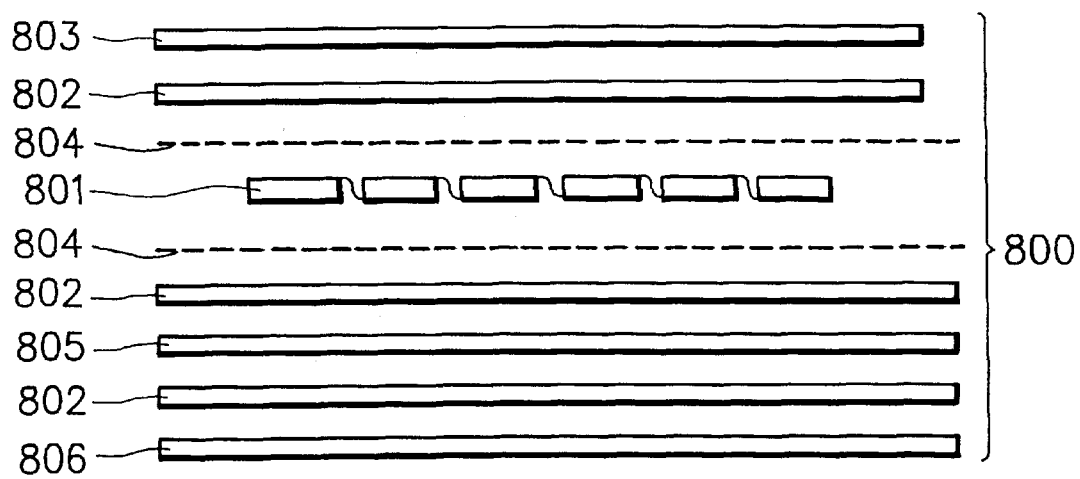
FIG. 8 is a schematic view illustrating the constitution of another example of a stacked body as a semiconductor device (or a solar cell module).

Using each of the cell groups obtained in the above step 1, there were prepared in the following manner a plurality of solar cell modules each comprising a stacked body of the configuration shown in FIG. 8.

First, there was prepared a stacked body 800 comprising an ETFE (tetrafluoroethyl-ethylene copolymer) film 803/an EVA sheet 802/a nonwoven glass fiber member 804/a cell group 801 (that is, the cell croup obtained in the above)/a nonwoven glass fiber member 804/an EVA sheet 802/a nylon film 805/an EVA sheet 802/a galvalume steel member 806.

Particularly, on the light incident side of the cell block 801 obtained in the above, there were laminated a nonwoven glass fiber member 804 comprising CRANE GLASS 230 (trademark name, produced by Crane Company), an EVA sheet 802 of 460 μm thickness comprising PHOTOCAP A9918 (trademark name, produced by Springborn Laboratories Company), and a nonstretched ETFE film 803 of 50 μm thickness having a surface treated by corona discharge (to be contacted with said EVA sheet 802) comprising a TEFZEL FILM (trademark name, produced by Du Pont Company) in the named order. On the rear side of the resultant, there were laminated a nonwoven glass fiber member 804 comprising CRANE GLASS 230 (trademark name, produced by Crane Company), an EVA sheet 802 of 460 µm thickness comprising PHOTOCAP A9918 (trademark name, produced by Springborn Laboratories Company), a nylon film 805 of 63.5 µm thickness comprising DARTEK (trademark name, produced by Du Pont Company), an EVA sheet 802 of 460 µm thickness comprising PHOTOCAP A9918 (trademark name, produced by Springborn Laboratories Company), and a galvalume steel member 836 of 0.27 mm thickness comprising TIMA-COLOR GL (trademark name, produced by Daido Kohan Kabushiki Kaisha) in the named order. Thus, there was obtained a stacked body 800.

The EVA sheet (comprising the PHOTOCAP A9918) used in the above has been widely used as a sealing member for a solar cell. It is comprised of a mixture of 100 parts by weight of an EVA (ethylene-vinyl acetate copolymer) resin (having a vinyl acetate content of 33 wt. %), 3.0 parts by weight of a crosslinking agent, 0.3 part by weight of an UV absorber, 0.1 part by weight of a photo stabilizer, 0.2 part by weight of an antioxidant, and 0.25 part by weight of a silane coupling agent.

The stacked body obtained in the above was treated as described below.

That is, the stacked body was placed in the single vacuum chambered laminator shown in FIG. 3, wherein the stacked body (which is indicated by reference numeral 306 in the figure) was positioned on the mounting table 301 such that the galvalume steel member 806 of the stacked. body contacted. the surface of the mounting table 301, and a silicone rubber sheet as, the flexible member 302 was superposed over the ETFE film 803 of the stacked. body on the mounting table 301 as; shown in FIG. 3. Thereafter, the space containing the stacked body 306 therein enclosed by the mounting table 301 and the silicone rubber sheet 302 was evacuated to a predetermined vacuum by operating the vacuum pump (not shown in the figure) through the openings of the exhaust system 304, whereby the flexible sheet 302 (the silicone rubber sheet) was sagged to compress the stacked body 306. Thereafter, while continuing this evacuation procedure, the space was held under a reduced pressure condition at a vacuum of 5 Torr for 5 minutes to thereby vacuum the stacked body, and thereafter, under this reduced pressure condition with the vacuum of 5 Torr, the stacked body thus vacuum-treated was heated to and maintained at 150° C. for 30 minutes by means of the electric heater 303, thereby heatfusing the EVA sheets of the stacked body 306 while crosslinking them. Thereafter, the electric heater 303 was switched off, air from a fan (not shown in the figure) was supplied to cool the stacked body to a temperature of about 40° C., and the evacuation procedures were terminated. The stacked body thus treated was removed from the laminator. By this method, there was obtained a solar cell modules.

In the above, the power output terminals 606a and 606b were extended to the rear side of the solar cell so that they could be wired to the outside through wiring holes previously provided in the galvalume steel member of the stacked body after the completion of the lamination treatment.

In this way, there were obtained a plurality of solar cell modules.

In the following, the above step of vacuuming the stacked body will be referred to as the first treatment step, and the above step of subjecting the vacuum-treated stacked body to heat-treatment under the reduced pressure condition will be referred to as the second treatment step.

Evaluation

Using the resultant solar cell modules, evaluation was conducted with respect to residual air bubbles, endurance against changes in environmental temperature, and endurance against changes in environmental temperature and humidity.

The results obtained are collectively shown in Table 1.

In Table 1, there are also shown the vacuum degrees in the first and second treatment steps, the period of time during which the first treatment step was conducted, and the outer size of the cell group in Example 1.

The evaluation of each of the above evaluation items was conducted in the following manner.

(1) Evaluation of the Residual Air Bubbles

The number of air bubbles remaining in the sealing material of the solar cell module was optically examined. The number of air bubbles found in the sealing material is shown in Table 1.

(2) Evaluation of the Endurance Against Changes in Environmental Temperature

The solar cell module was subjected to 50 repetitions of a cycle of alternately exposing it to an atmosphere of −40° C. for one hour and exposing it to an atmosphere of 90° C. for one hour, and thereafter, its exterior appearance was observed. The observed result is shown in Table 1. The mark ○ in Table 1 indicates a case where no change was observed in the exterior appearance. As for cases with a change in the exterior appearance, comments are described in Table 1.

(3) Evaluation of the Endurance Against Changes in Environmental Temperature and Humidity The solar cell module was subjected to 50 repetitions of a cycle of alternately exposing it to an atmosphere of −40° C. for one hour and exposing it to an atmosphere of 80° C./85%RH for 4 hours, and thereafter, its exterior appearance was observed. The observed result is shown in Table 1. The mark ○ in Table 1 indicates a case where no change was observed in the exterior appearance. As for cases with a change in the exterior appearance, comments are described in Table 1.

EXAMPLE 2

The procedures of Example 1 were repeated, except that in the preparation of the stacked body, an increased number of a-Si solar cells were integrated in series connection to obtain a cell group having an outer size of 600 mm×1200 mm, and using this cell group, a stacked body having a greater size than that of the stacked body in Example 1 was obtained and that the 5 minutes duration of the first treatment step (that is, the step of vacuuming the stacked body at a vacuum of 5 Torr) prior to the start of the second treatment step (that is, the step of subjecting the vacuum-treated stacked body to the heat treatment) in Example 1 was changed to 10 minutes because the stacked body having such greater size was considered to have an increased amount of gaps present therein and therefore to have a greater exhaustion resistance than that of the stacked body in Example 1, to thereby obtain a solar cell module.

In this way, there were prepared a plurality of solar cell modules.

Using the resultant solar cell modules, evaluation was conducted in the same manner as in Example 1.

The results obtained are collectively shown in Table 1.

In Table 1, there are also shown the vacuum degrees in the first and second treatment steps, the period of time during which the first treatment step was conducted, and the outer size of the cell group in Example 2.

EXAMPLE 3

There were prepared a plurality of cell groups each comprising a plurality of a-Si solar cells integrated in series connection in the same manner as in Example 1.

Figure 9:
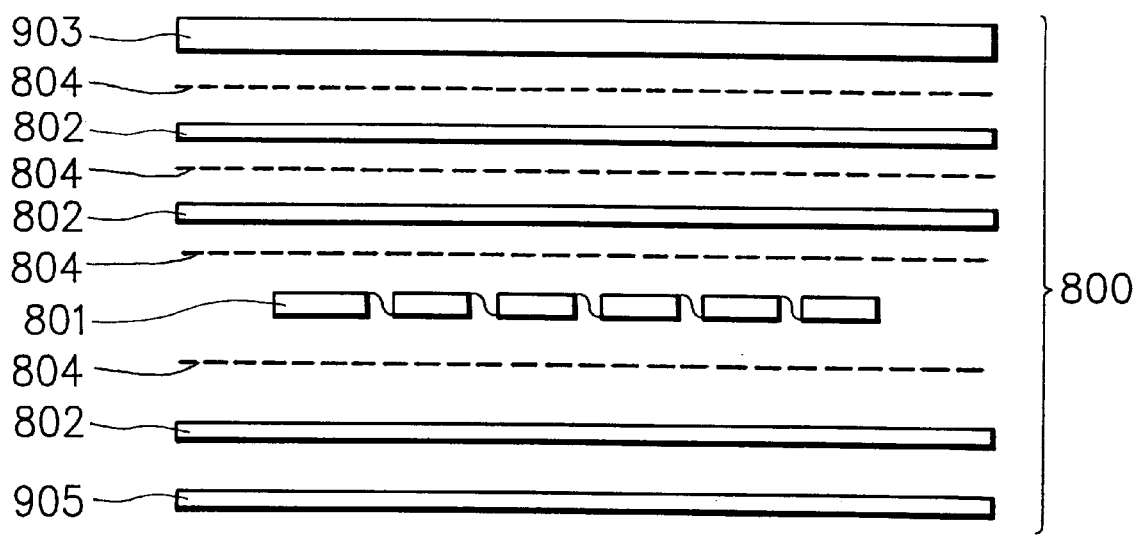
FIG. 9 is a schematic view illustrating the constitution of a further example of a stacked body as a semiconductor device (or a solar cell module).

Using each of the cell groups obtained in the above, there were prepared in the following manner a plurality of solar cell modules each comprising a stacked body of the configuration shown in FIG. 9.

That is, there was prepared a stacked body 800 comprising a glass plate 903/a nonwoven glass fiber member 804/an EVA sheet 802/a nonwoven glass fiber member 804/an EVA sheet 802/a nonwoven glass fiber member 804/a cell group 801 (that is, the cell group obtained in the above)/a nonwoven glass fiber member 804/an EVA sheet 802/a Tedlar film 905.

Particularly, on the light incident side of the cell group 801 obtained in the above, there were laminated a nonwoven glass fiber member 804 comprising CRANE GLASS 230 (trademark name, produced by Crane Company), an EVA sheet 802 of 800 µm thickness comprising PHOTOCAP A9918 (trademark name, produced by Springborn Laboratories Company), a nonwoven glass fiber member 804 comprising CRANE GLASS 230 (trademark name, produced by Crane Company), an EVA sheet 802 of 800 µm thickness comprising PHOTOCAP A9918 (trademark name, produced by Springborn Laboratories Company), a nonwoven glass fiber member 804 comprising CRANE GLASS 230 (trademark name, produced by Crane Company), and a tempered glass plate 903 of 3.2 mm thickness comprising SOLATEX (trademark name, produced by AFG company) in the named order. On the rear side of the resultant, there were laminated a nonwoven glass fiber member 804 comprising CRANE GLASS 230 (trademark name, produced by Crane Company), an EVA sheet 802 of 800 µm thickness comprising PHOTOCAP A9918 (trademark name, produced by Springborn Laboratories Company), and a Tedlar film (an aluminum foil sandwiched with Tedlar (trademark name)) 905 (produced by Tohkaialumihaku Kabushiki Kaisha) in the named order. Thus, there was obtained a stacked body 800.

The stacked body obtained in the above was treated as described below.

That is, the stacked body was placed in the single vacuum chambered laminator shown in FIG. 3, wherein the stacked body (which is indicated by reference numeral 306 in the figure) was positioned on the mounting table 301 such that the glass plate 903 of the stacked body contacted the surface of the mounting table 301, and a silicone rubber sheet as the flexible member 302 was superposed over the Tedlar film 905 of the stacked body as shown in FIG. 3. Thereafter, the stacked body was treated by repeating the treating procedures in Example 1 using the laminator shown in FIG. 3.

Thus, there was obtained a solar cell module.

In the above, the power output terminals 606a and 606b were extended to the rear side of the solar cell so that they could be wired to the outside after the completion of the lamination treatment through wiring holes previously provided in the Tedlar film of the stacked body.

In this way, there were obtained a plurality of solar cell modules.

Using the resultant solar cell modules, evaluation was conducted in the same manner as in Example 1.

The results obtained are collectively shown in Table 1.

In Table 1, there are also shown the vacuum degrees in the first and second treatment steps, the period of time during which the first treatment step was conducted, and the outer size of the cell. group in Example 3.

EXAMPLE 4

There were prepared a plurality of solar cell modules in the same manner as in Example 1, except that the stacked body was treated as described below.

Figure 1:
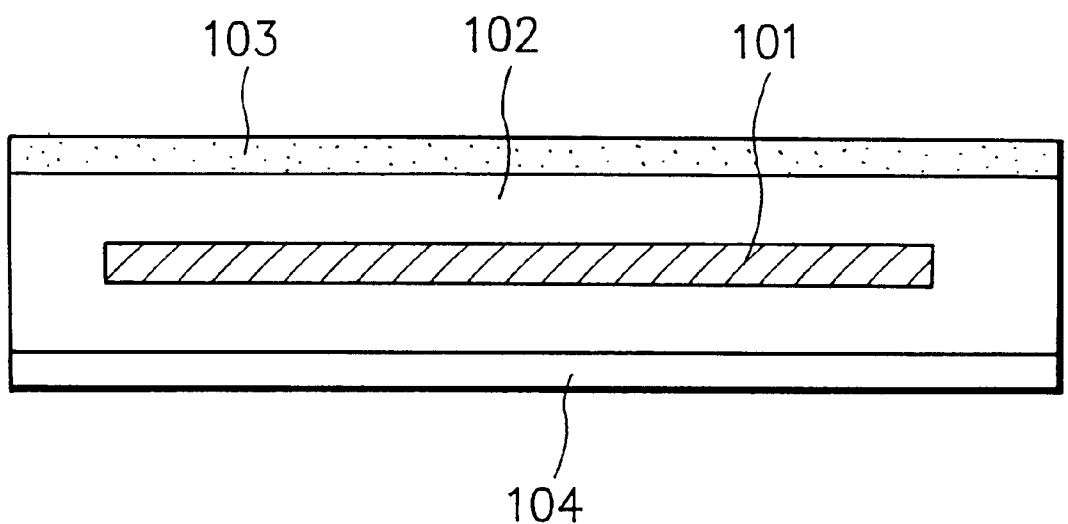
FIG. 1 is a schematic cross-sectional view illustrating a conventional solar cell module.
Figure 2:
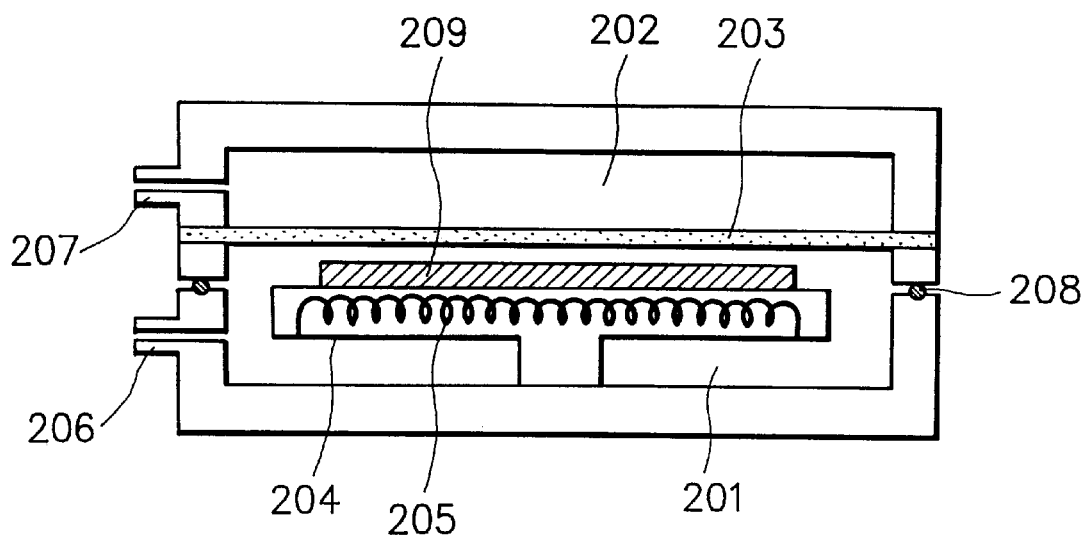
FIG. 2 is a schematic diagram illustrating a laminator of a double vacuum chamber type.

That is, the stacked body was introduced into the double vacuum chambered laminator shown in FIG. 2, wherein the stacked body (which is indicated by reference numeral 209) was positioned on the mounting table 204 of the lower chamber 201 such that the galvalume steel member 806 of the stacked body contacted the surface of the mounting table 204 as shown in FIG. 2. Then, the interior of each of the upper chamber 202 and the lower chamber 201 was evacuated by the vacuum pump (not shown in the figure) to a vacuum of 5 Torr for 5 minutes, followed by energizing the electric heater 205 of the mounting table 204 to heat the stacked body to 100° C. The inside of the upper chamber 202 was returned to atmospheric pressure while continuing the evacuation of the lower chamber 201 at the above vacuum of 5 Torr, whereby the flexible member 203 (comprising a silicone rubber sheet) was sagged to compress the stacked body, and the stacked body 209 was heated to and maintained at 150° C. for 30 minutes by means of the electric heater 205 under a vacuum of 2 Torr thereby heatfusing the EVA sheets of the stacked body 209 while crosslinking them. Thereafter, the electric heater was switched off, the stacked body was cooled to a temperature of about 40° C. by circulating cooling water within the mounting table (this is not shown in the figure), and the evacuation procedures were terminated. The stacked body thus treated was taken out from the laminator. Thus, there was obtained a solar cell module.

In this way, there were obtained a plurality of solar cell modules.

Using the resultant solar cell modules, evaluation was conducted in the same manner as in Example 1.

The results obtained are collectively shown in Table 1.

In Table 1, there are also shown the vacuum degrees in the first and second treatment steps, the period of time during which the first treatment step was conducted, and the outer size of the cell group in Example 4.

EXAMPLE 5

The procedures of Example 1 were repeated, except that in the preparation of the stacked body, no nonwoven glass fiber members were used and the 5 minutes duration of the first treatment step (that is, the step of vacuuming the stacked body at a vacuum of 5 Torr) prior to the start of the second treatment step (that is, the step of subjecting the vacuum-treated stacked body to the heat treatment) in Example 1 was changed to 40 minutes for the reason that the nonwoven glass fiber member's exhaustion assisting effect for the gaps present in the stacked body could not be expected because of not using any nonwoven glass fiber members, to thereby obtain a solar cell module.

In this way, there were prepared a plurality of solar cell modules.

Using the resultant solar cell modules, evaluation was conducted in the same manner as in Example 1.

The results obtained are collectively shown in Table 1.

In Table 1, there are also shown the vacuum degrees in the first and second treatment steps, the period of time during which the first treatment step was conducted, and the outer size of the cell group in Example 5.

EXAMPLE 6

The procedures of Example 1 were repeated, except the 5 minutes duration of the first treatment step (that is, the step of vacuuming the stacked body at the vacuum of 5 Torr) prior to the start of the second treatment step (that is, the step of subjecting the vacuum-treated stacked body to the heat treatment) in Example 1 was changed to 50 minutes, to thereby obtain a solar cell module.

In this way, there were prepared a plurality of solar cell modules.

Using the resultant solar cell modules, evaluation was conducted in the same manner as in Example 1.

The results obtained are collectively shown in Table 1.

In Table 1, there are also shown the vacuum degrees in the first and second treatment steps, the period of time during which the first treatment step was conducted, and the outer size of the cell group in Example 6.

Comparative Example 1

The procedures of Example 1 were repeated, except that the 5 minutes duration of the first treatment step (that is, the step of vacuuming the stacked body at the vacuum of 5 Torr) prior to the start of the second treatment step (that is, the step of subjecting the vacuum-treated stacked body to the heat treatment) in Example 1 was changed to 3 minutes, to thereby obtain a solar cell module.

In this way, there were prepared a plurality of solar cell modules.

Using the resultant solar cell modules, evaluation was conducted in the same manner as in Example 1.

The results obtained are collectively shown in Table 1.

In Table 1, there are also shown the vacuum degrees in the first and second treatment steps, the period of time during which the first treatment step was conducted, and the outer size of the cell group in Comparative Example 1.

Comparative Example 2

The procedures of Example 1 were repeated, except that the vacuum degree of 5 Torr in not only the first treatment step (that is, the step of vacuuming the stacked body) prior to the start of the second treatment step (that is, the step of subjecting the vacuum-treated stacked. body to the heat treatment) but also the second treatment step in Example 1 was changed to 10 Torr, to thereby obtain a solar cell module.

In this way, there were prepared a plurality of solar cell modules.

Using the resultant solar cell modules, evaluation was conducted in the same manner as in Example 1.

The results obtained are collectively shown in Table 1.

In Table 1, there are also shown the vacuum degrees in the first and second treatment steps, the period of time during which the first treatment step was conducted, and the outer size of the cell group in Comparative Example 2.

Comparative Example 3

The procedures of Example 2 were repeated, except that the 5 minutes duration of the first treatment step (that is, the step of vacuuming the stacked body at the vacuum degree of 5 Torr) prior to the start of the second treatment step (that is, the step of subjecting the vacuum-treated stacked body to the heat treatment) in Example 2 was changed to 3 minutes, to thereby obtain a solar cell module.

In this way, there were prepared a plurality of solar cell modules.

Using the resultant solar cell modules, evaluation was conducted in the same manner as in Example 1.

The results obtained are collectively shown in Table 1.

In Table 1, there are also shown the vacuum degrees in the first and second treatment steps, the period of time during which the first treatment step was conducted, and the outer size of the cell group in Comparative Example 3.

Comparative Example 4

The procedures of Example 3 were repeated, except that the 5 minutes duration of the first treatment step (that is, the step of vacuuming the stacked body at the vacuum of 5 Torr) prior to the start of the second treatment step (that is, the step of subjecting the vacuum-treated stacked body to the heat treatment) in Example 3 was changed to 3 minutes, to thereby obtain a solar cell module.

In this way, there were prepared a plurality of solar cell modules.

Using the resultant solar cell modules, evaluation was conducted in the same manner as in Example 1.

The results obtained are collectively shown in Table 1.

In Table 1, there are also shown the vacuum degrees in the first and second treatment steps, the period of time during which the first treatment step was conducted, and the outer size of the cell group in Comparative Example 4.

Comparative Example 5

The procedures of Example 3 were repeated, except that the vacuum degree of 5 Torr in not only the first treatment step (that is, the step of vacuuming the stacked body) prior to the start of the second treatment step (that is, the step of subjecting the vacuum-treated stacked body to the heat treatment) but also the second treatment step in Example 3 was changed to 10 Torr, to thereby obtain a solar cell module.

In this way, there were prepared a plurality of solar cell modules.

Using the resultant solar cell modules, evaluation was conducted in the same manner as in Example 1.

The results obtained are collectively shown in Table 1.

In Table 1, there are also shown the vacuum degrees in the first and second treatment steps, the period of time during which the first treatment step was conducted, and the outer size of the cell group in Comparative Example 5.

Comparative Example 6

The procedures of Example 4 were repeated, except that the vacuum of the inside of each of the upper chamber 202 and lower chamber 201 until the pressure of the inside of the upper chamber 202 was returned to atmospheric pressure was maintained at 15 Torr and that the vacuum of the inside of the lower chamber 201 after the pressure of the inside of the upper chamber 202 was returned to atmospheric pressure was held at 10 Torr, to thereby obtain a solar cell module.

In this way, there were prepared a plurality of solar cell modules.

Using the resultant solar cell modules, evaluation was conducted in the same manner as in Example 1.

The results obtained are collectively shown in Table 1.

In Table 1, there are also shown the vacuum degrees in the first and second treatment steps, the period of time during which the first treatment step was conducted, and the outer size of the cell group in Comparative Example 6.

Comparative Example 7

The procedures of Example 5 were repeated, except that the 40 minutes duration of the first treatment step (that is, the step of vacuuming the stacked body at the vacuum of 5 Torr) prior to the start of the second treatment step (that is, the step of subjecting the vacuum-treated stacked body to the heat treatment) in Example 5 was changed to 3 minutes, to thereby obtain a solar cell module.

In this way, there were prepared a plurality of solar cell modules.

Using the resultant solar cell modules, evaluation was conducted in the same manner as in Example 1.

The results obtained are collectively shown in Table 1.

In Table 1, there are also shown the vacuum degrees in the first and second treatment steps, the period of time during which the first treatment step was conducted, and the outer size of the cell group in Comparative Example 7.

ronmental temperature and humidity (the temperature and humidity cycle test).

On the other hand, it is understood that each of the solar cell modules obtained in the above comparative examples wherein the vacuum in the first treatment step (that is, the step of vacuuming the stacked body) and the second treatment step (that is, the step of subjecting the vacuum-treated stacked body to heat treatment) was beyond 5 Torr has a number of residual air bubbles therein.

Further, in the case where the duration of the first treatment step (that is, the step of vacuuming the stacked body) is less than 5 minutes, it is understood that microdelaminations of several millimeters in diameter occurred at the interface between the film and the sealing material in the temperature cycle test and the temperature and humidity cycle test.

In the case of Example 6 wherein the duration of the first treatment step (that is, the step of vacuuming the stacked body) was 50 minutes, it is understood that the solar cell module obtained is not problematic in terms of residual air bubbles and reliability. But it seems that the solar cell production process of Example 6 is not always satisfactory in terms of productivity.

Now, it is necessary for a solar cell module to have no air bubbles therein and to have an excellent exterior appearance in order to secure long use reliability in the outdoors. It can

TABLE 1

| | vacuum degree (Torr) | | | | | evaluation results | |
|---|---|---|---|---|---|---|---|
| | first treatment step (*1) | second treatment step (*2) | period of time for the first treatment step (min.) | outer size of cell block (mm × mm) | residual air bubble (number of air bubbles remained) | endurance against changes in environmental temperature | endurance against changes in environmental temperature and humidity |
| Example 1 | 5 | 5 | 5 | 300 × 1200 | 0 | ◯ | ◯ |
| Example 2 | 5 | 5 | 10 | 600 × 1200 | 0 | ◯ | ◯ |
| Example 3 | 5 | 5 | 5 | 300 × 1200 | 0 | ◯ | ◯ |
| Example 4 | 5 | 2 (after the stacked body was compress-bonded) | 5 | 300 × 1200 | 0 | ◯ | ◯ |
| Example 5 | 5 | 5 | 40 | 300 × 1200 | 0 | ◯ | ◯ |
| Example 6 | 5 | 5 | 50 | 300 × 1200 | 0 | ◯ | ◯ |
| Comparative Example 1 | 5 | 5 | 3 | 300 × 1200 | 5~10 | ◯ | ◯ |
| Comparative Example 2 | 10 | 10 | 5 | 300 × 1200 | >100 | the surface protective film peeled | the surface protective film peeled |
| Comparative Example 3 | 5 | 5 | 3 | 600 × 1200 | 10~20 | ◯ | ◯ |
| Comparative Example 4 | 5 | 5 | 3 | 300 × 1200 | 5~10 | ◯ | ◯ |
| Comparative Example 5 | 10 | 10 | 5 | 300 × 1200 | >100 | ◯ | ◯ |
| Comparative Example 6 | 15 | 10 (after the stacked body was compress-bonded) | 5 | 300 × 1200 | >100 | the surface protective film peeled | the surface protective film peeled |
| Comparative Example 7 | 5 | 5 | 3 | 300 × 1200 | >100 | ◯ | ◯ |

*1: the step of vacuuming the stacked body
*2: the step of subjecting the vacuum-treated stacked body to heat treatment Based on the results shown in Table 1, the following facts are understood. That is, each of the solar cell modules obtained in the above examples is absolutely free of residual air bubbles and has an excellent exterior appearance.

And it is understood that each of the solar cell modules obtained in the above examples is satisfactory in endurance against changes in environmental temperature (the temperature cycle test) and the endurance against changes in envibe said that each of the solar cell modules obtained in the above examples meets these conditions.

As is apparent from the above results, according to the present invention, there are provided such various advantages as will be described below.

(1) By subjecting a stacked body as a solar cell module to vacuum compression treatment, the stacked body becomes free of residual air bubbles therein.

Particularly, by sufficiently vacuuming the stacked body, the air present in the gaps of the stacked body is sufficiently released to the outside to prevent the stacked body from suffering generation of air bubbles therein.

(2) It is possible to produce a semiconductor device such as a solar cell module which is free of the generation of a separation between front the surface material and the sealing resin in reliability tests such as a temperature cycle test, a temperature and humidity cycle test, and the like. Particularly, as the vacuum of the space containing a stacked body as the semiconductor device therein is made to be 5 Torr or less, when the sealing resin of the stacked body is crosslinked by means of an organic peroxide, the occurrence of a covalent bonding between the front surface material and the sealing resin and the crosslinking of the sealing resin itself are not hindered by oxygen. Consequently, an improvement in the adhesion between the front surface material and the sealing resin is obtained, resulting in making the semiconductor device have an improved reliability.

(3) By inserting a nonwoven glass fiber member and/or a nonwoven organic resin fiber member in a stacked semiconductor body such as a solar cell, there can be attained a markedly improved vacuum compression treatment effect for the stacked body. That is, these nonwoven fiber members disposed in the stacked body assist the release of the air present in the stacked body in the vacuum compression treatment, and because of this, the stacked body subjected to the vacuum compression treatment contains substantially zero air bubbles therein.

(4) By using EVA (ethylene-vinyl acetate copolymer) at least as the sealing resin between the semiconductor element (or the photovoltaic element) and the front surface material, those effects previously described are provided without greatly changing the constitution of the conventional covering material.

(5) By crosslinking EVA used as the sealing resin with an organic peroxide, the sealing resin attains an improved heat resistance. That is, problems such that the sealing resin is softened under use at a high temperature to cause a separation at the surface material and wherein the softened sealing resin flows to the outside do not occur. In addition, the crosslinking of the sealing resin is not hindered by oxygen, and because of this, the reliability of the semiconductor device (the solar cell module) is markedly improved for the reasons described in the above (2).

(6) By employing the foregoing single vacuum chamber system of supporting a stacked body as a semiconductor device such as a solar cell module between the mounting table and the flexible member (comprising a silicone rubber member) and evacuating the space between the mounting table and the flexible member to compress the stacked body by the flexible member, there are provided advantages such that the structure of the laminator used in the production of a semiconductor device such as a solar cell module can be simplified and the apparatus cost can be desirably reduced. This situation makes it unnecessary to have a large facility investment for the mass-production of a semiconductor device such as a solar cell module. Further, various laminators can be optionally used. In addition, the advantages of the present invention when said single vacuum chamber system is employed are significant.

That is, in the case of the conventional single chamber system, when the compression treatment of a stacked body as a semiconductor device such as a solar cell module is conducted at the same time when the stacked body is evacuated, there entail problems in that the gaps in the stacked body become markedly narrower in comparison with the case of using the conventional double vacuum chamber system and therefore, the stacked body has a large exhaustion resistance, and because of this, residual air bubbles are very likely to occur after the vacuum compression treatment. However, the present invention markedly improves this situation.

(7) By using a fluorine-containing polymer film as the transparent front surface material, there can be attained a surface covering material having an excellent weatherability for a semiconductor device such as a solar cell module. Particularly, the use of the sealing resin and the fluorine-containing polymer in combination provides excellent weatherability.

(8) By using a film composed of ETFE (ethylene-tetrafluoroethylene copolymer) as the fluorine-containing polymer film, there can be attained a surface covering material excelling in weatherability, transparency, and physical strength for a semiconductor device such as a solar cell module.

(9) By using the fluorine-containing polymer film having a corona-discharged surface in contact with the sealing resin, there can be attained an improvement in the adhesion between the sealing resin and the fluorine-containing polymer film.

Further, the process of producing a semiconductor device such as a solar cell module in the present invention is not limited to the above examples. These examples may be optionally modified within the range of the principle of the present invention. The semiconductor element used in the present invention can include, besides photovoltaic elements, other photoelectric conversion elements such as photodetectors and light emitting elements.

Incidentally, as may be apparent from the above description, the process of the present invention of producing a semiconductor device including a solar cell module comprises the steps of providing a stacked body comprising a semiconductor element (such as a photovoltaic element or the like) and a sealing resin which are interposed between a front surface protective member and a back face protective member, evacuating said stacked body at a vacuum of 5 Torr or less for 5 to 40 minutes, subjecting said stacked body thus vacuum-treated to thermocompression bonding under a vacuum of 5 Torr or less, and cooling said stacked body subjected to said thermocompression bonding so as to engage in contact bonding. According to this process, the stacked body is sufficiently evacuated to release the air present in the gaps of the stacked body, whereby the stacked body is effectively prevented from the occurrence of air bubbles therein. And, in the case where the sealing resin is crosslinked by means of an organic peroxide, the formation of a covalent bonding between the front surface protective member and the sealing resin and the crosslinking of the sealing resin itself are not hindered by oxygen. Therefore, an excellent adhesion between the front surface protective member and the sealing resin can be attained. In addition, even under a use condition with a high temperature, the sealing resin is hardly softened and therefore, separation hardly occurs at the interface between the front surface protective member and the sealing resin. Hence, the semiconductor device is highly reliable.

What is claimed is:

1. A semiconductor device having a semiconductor element, wherein said semiconductor device comprises a stacked body formed by the process comprising:
   (a) providing a laminate comprising said semiconductor element and a sealing resin which are interposed between a front surface member and a back face member;
   (b) subjecting said laminate to a vacuum-treatment at a reduced pressure of 5 Torr or less and maintaining the laminate at said reduced pressure for 5 to 40 minutes;
   (c) subjecting the vacuum-treated laminate to thermocompression bonding at a reduced pressure of 5 Torr or less; and
   (d) cooling the thermocompressed laminate to contact bond the laminate,
   wherein the surface member comprises a transparent film composed of a fluorine-containing polymer.

2. A semiconductor device according to claim 1, wherein the fluorine-containing polymer is ethylene-tetrafluoroethylene copolymer.

3. A semiconductor device according to claim 1, wherein the transparent fluorine-containing polymer film has a corona-discharged surface in contact with the sealing resin.

4. A semiconductor device having a semiconductor element, wherein said semiconductor device comprises a stacked body formed by the process comprising:
   (a) providing a laminate comprising said semiconductor element and a sealing resin which are interposed between a front surface member and a back face member;
   (b) subjecting said laminate to a vacuum-treatment at a reduced pressure of 5 Torr or less and maintaining the laminate at said reduced pressure for 5 to 40 minutes;
   (c) subjecting the vacuum-treated laminate to thermocompression bonding at a reduced pressure of 5 Torr or less; and
   (d) cooling the thermocompressed laminate to contact bond the laminate,
   wherein the sealing resin is positioned between the semiconductor element and the surface member, the sealing resin comprises ethylene-vinyl acetate copolymer, and the ethylene-vinyl acetate copolymer is crosslinked by an organic peroxide.

5. A process for producing a semiconductor device having a semiconductor element, said process comprising the steps of:
   (a) providing a laminate comprising said semiconductor element and a sealing resin which are interposed between a front surface member and a back face member;
   (b) superposing a flexible sheet on said laminate and subjecting said laminate to a vacuum-treatment consisting essentially of subjecting the laminate to a reduced pressure of 5 Torr or less and maintaining the laminate at said reduced pressure for 5 to 40 minutes;
   (c) subjecting the vacuum-treated laminate to thermocompression bonding at a reduced pressure of 5 Torr or less while heating the vacuum-treated laminate at a temperature at which the sealing resin of the laminate is crosslinked; and
   (d) cooling the thermocompressed laminate to contact bond the laminate.

6. The process according to claim 5, wherein the thermocompression bonding of the laminate comprises the steps of supporting the laminate between a mounting table and a flexible member, and evacuating a space between said mounting table and said flexible member to reduce the pressure therein and compress the laminate.

7. The process according to claim 6, wherein the flexible member is a flexible sheet.

8. The process according to claim 6, wherein the pressure is reduced only in the space between the mounting table and the flexible member.

9. The process according to claim 6, wherein the pressure is reduced only in the space which is underneath the flexible member and which is on a side where the mounting table is provided.

10. The process according to claim 5, wherein the laminate has a nonwoven glass fiber, a nonwoven organic resin fiber, or both of these fibers inserted therein.

11. The process according to claim 5, wherein the sealing resin is positioned between the semiconductor element and the surface member, and the sealing resin comprises ethylene-vinyl acetate copolymer.

12. The process according to claim 5, wherein the thermocompression bonding of the laminate is conducted by utilizing a flexible sheet which is larger than the laminate.

13. The process according to claim 5, wherein the semiconductor element is a photoelectric conversion element.

14. The process according to claim 5, wherein the semiconductor element is a photovoltaic element.

15. The process according to claim 5, wherein the semiconductor element is a photodetector or a light emitting element.

16. The process according to claim 5, wherein the semiconductor device is a solar cell module.

17. A process for producing a semiconductor device by subjecting a laminate comprising a semiconductor element and a sealing resin which are interposed between a front surface member and a back face member to thermocompression bonding under reduced pressure, wherein said process comprises the steps of:
   (a) subjecting said laminate to a vacuum-treatment at a reduced pressure of 5 Torr or less and maintaining the laminate at said reduced pressure for 5 to 40 minutes;
   (b) subjecting the vacuum-treated laminate to thermocompression bonding at a reduced pressure of 5 Torr or less; and
   (c) cooling the thermocompressed laminate to contact bond the laminate,
   wherein the sealing resin is positioned between the semiconductor element and the surface member, the sealing resin comprises ethylene-vinyl acetate copolymer, and the ethylene-vinyl acetate copolymer is crosslinked by an organic peroxide.

18. A process for producing a semiconductor device by subjecting a laminate comprising a semiconductor element and a sealing resin which are interposed between a front surface member and a back face member to thermocompression bonding under reduced pressure, wherein said process comprises the steps of:
   (a) subjecting said laminate to a vacuum-treatment at a reduced pressure of 5 Torr or less and maintaining the laminate at said reduced pressure for 5 to 40 minutes;
   (b) subjecting the vacuum-treated laminate to thermocompression bonding at a reduced pressure of 5 Torr or less; and
   (c) cooling the thermocompressed laminate to contact bond the laminate,
   wherein the surface member comprises a transparent film composed of a fluorine-containing polymer.

19. The process according to claim 18, wherein the fluorine-containing polymer is ethylene-tetrafluoroethylene copolymer.

20. The process according to claim 18, wherein the transparent fluorine-containing polymer film has a corona-discharged surface in contact with the sealing resin.

21. A process for producing a semiconductor device by subjecting a laminate comprising a semiconductor element and a sealing resin which are interposed between a front surface member and a back face member to thermocompression bonding under reduced pressure, wherein said process comprises the steps of:
  (a) subjecting said laminate to a vacuum-treatment at a reduced pressure of 5 Torr or less and maintaining the laminate at said reduced pressure far 5 to 40 minute;
  (b) subjecting the vacuum-treated laminate to thermo-compression bonding at a reduced pressure of 5 Torr or less; and
  (c) cooling the thermocompressed laminate to contact bond the laminate,
  wherein the thermocompression bonding of the laminate comprises the steps of supporting the laminate between a mounting table and a flexible member, and evacuating a space between said mounting table and said flexible member to reduce the pressure therein and compress the laminate, and
  wherein the flexible member is a silicone rubber sheet.

22. A process for producing a semiconductor device by subjecting a laminate comprising a semiconductor element and a sealing resin which are interposed between a front surface member and a back face member to thermocompression bonding under reduced pressure, wherein said process comprises the steps of:
  (a) subjecting said laminate to a vacuum-treatment at a reduced pressure of 5 Torr or less and maintaining the laminate at said reduced pressure for 5 to 40 minutes;
  (b) subjecting the vacuum-treated laminate to thermo-compression bonding at a reduced pressure of 5 Torr or less; and
  (c) cooling the thermocompressed laminate to contact bond the laminate,
  wherein the thermocompression bonding of the laminate comprises the steps of supporting the laminate between a mounting table and a flexible member, and evacuating a space between said mounting table and said flexible member to reduce the pressure therein and compress the laminate, and
  wherein the pressure is reduced on both sides of the flexible member, and the thermocompression bonding of the laminate includes a step of increasing the pressure on the side of the flexible member which is opposite to the mounting table.

\* \* \* \* \*

UNITED STATES PATENT AND TRADEMARK OFFICE
CERTIFICATE OF CORRECTION

PATENT NO. : 6,320,115 B1
DATED : November 20, 2001
INVENTOR(S) : Ichiro Kataoka et al.

It is certified that error appears in the above-identified patent and that said Letters Patent is hereby corrected as shown below:

Column 9,
Line 37, "silicon." should read -- silicon --.

Column 11,
Line 1, "when." should read -- when --;
Line 8, "it," should read -- it --;
Line 22, "crass-linking" should read -- cross-linking --.

Column 16,
Line 56, "croup" should read -- group --.

Column 17,
Line 14, "837" should read -- 807 --;
Line 33, "stacked." should read -- stacked --;
Line 34, "contacted." should read -- contacted --;
Line 35, "as," should read -- as --;
Line 36, "stacked." should read -- stacked --;
Line 37, "as;" should read -- as --.

Column 20,
Line 5, "cell." should read -- cell --.

Column 21,
Line 50, "stacked." should read -- stacked --.

Column 25,
Line 8, "front the" should read -- the front --.

UNITED STATES PATENT AND TRADEMARK OFFICE
CERTIFICATE OF CORRECTION

PATENT NO. : 6,320,115 B1
DATED : November 20, 2001
INVENTOR(S) : Ichiro Kataoka et al.

It is certified that error appears in the above-identified patent and that said Letters Patent is hereby corrected as shown below:

Column 29,
Line 15, "far" should read -- for --.

Signed and Sealed this

Twenty-first Day of May, 2002

Attest:

*Attesting Officer*

JAMES E. ROGAN
*Director of the United States Patent and Trademark Office*